United States Patent [19]
Wang et al.

[11] Patent Number: 5,545,585
[45] Date of Patent: Aug. 13, 1996

[54] METHOD OF MAKING A DRAM CIRCUIT WITH FIN-SHAPED STACKED CAPACITORS

[75] Inventors: Chen-jong Wang; Mong-song Liang; Shou-gwo Wuu; Chung-Hui Su, all of Hsin-chu, Taiwan

[73] Assignee: Taiwan Semiconductor Manufacturing Company, Hsin-chu, Taiwan

[21] Appl. No.: 593,767

[22] Filed: Jan. 29, 1996

[51] Int. Cl.⁶ ............................ H01L 21/70; H01L 27/00
[52] U.S. Cl. ................... 437/52; 437/60; 437/919
[58] Field of Search ................... 437/47–48, 52, 437/60, 919; 257/306–310; 148/DIG. 14

[56] References Cited

U.S. PATENT DOCUMENTS

| | | | |
|---|---|---|---|
| 5,053,351 | 10/1991 | Fazan et al. | 437/52 |
| 5,164,881 | 11/1992 | Ahu | 437/52 |
| 5,185,282 | 2/1993 | Lee et al. | 437/52 |
| 5,403,767 | 4/1995 | Kim | 437/52 |

Primary Examiner—H. Jey Tsai
Attorney, Agent, or Firm—George O. Saile

[57] ABSTRACT

A novel method is presented for making an array of stacked capacitors on DRAM circuits. Chemical/Mechanical Polishing (CMP) is used to form "globally" a very planar surface on an insulating layer across the substrate. By virtue of this global planarization three additional insulating layers deposited consecutively thereon, also provide a very planar surface for exposing and developing high fidelity (distortion free) photoresist images. Subsequent anisotropic plasma etching of deposited layers on these planar surfaces also provide residue free (strings) structures. Stacked capacitors are then fabricated by etching contact openings in the insulating layers to the source/drain areas of FETs on the substrate. Alternate insulating layers having different etch rates are isotropic wet etched in the contact openings to recess and form fin-shaped profiles in the openings sidewalls. A polysilicon layer is deposited on the planar insulating layer surface and in the contact openings, and patterned forming fin-shaped bottom electrodes. The planar insulating layers are removed, and the capacitors are completed by forming a thin dielectric on the bottom electrode, and depositing and patterning the top polysilicon electrode.

24 Claims, 5 Drawing Sheets

METHOD OF MAKING A DRAM CIRCUIT WITH FIN-SHAPED STACKED CAPACITORS

BACKGROUND OF THE INVENTION

(1) Field of the Invention

The present invention relates to the fabrication of a dynamic random access memory (DRAMs) device, and more particularly a method for fabrication fin-shaped stacked capacitors for DRAM cells using an improved semiconductor process.

(2) Description of the Prior Art

The integrated circuit density on chips diced from semiconductor substrates has dramatically increased in recent years. This increase in density is due to advances in ultra large scale integration (ULSI) technologies. For example, advances in high resolution photolithography using shorter ultra violet (UV) wavelengths have significantly reduced the photoresist minimum image size. Another ULSI technology that has increased the circuit density is anisotropic plasma etching in which the directional etching by ions provides an essentially bias free replication of the photoresist image in the underlying patterned layer, such as in polysilicon, insulating oxides, and metals layers. These advances have come, however, with certain processing problems. For example, the high resolution lithography requires a shallow depth of focus (DOF), and exposing the photoresist over a rough topography results in distorted photoresist images. The patterning of layers by directional etching over rough topography results in incomplete removal of the layer over the steep steps, usually referred to as stringers, rails, or fences because of their appearances under the microscope. However, these and other technological advances are still used on many integrated circuit devices even with these process limitations.

One specific type of integrated circuit device where this high resolution processing is of particular importance is the dynamic random access memory (DRAM) circuit. This DRAM circuit is used extensively in the electronic industry and particularly in the computer industry for electrical data storage. These DRAM circuits consist of an array of individual memory cells, each cell usually consists of a field effect transistor (FET) switch and a single storage capacitor. Information is stored on the cell as charge on the capacitor which represents a unit of data (bit), that is accessed by read/write circuits on the periphery of the chip. By the year 2002 the number of these cells are expected to reach 256 megabits per DRAM chip. To achieve this advance in data storage and still maintain a reasonable chip size, the individual cells on the chip must be significantly reduced in size. As these individual memory cells decrease in size, so must the area on the cell that the storage capacitor occupies. The reduction in the storage capacitor size makes it difficult to store sufficient charge on the capacitor to maintain an acceptable signal-to-noise level, and circuit requires shorter refresh cycle times to retain the necessary charge level.

One method of overcoming this size problem is to build stacked capacitor which extend vertically over the cell areas to increase the electrode capacitor area while confining the capacitor within the cell area. A method of forming a stacked capacitor having fin-shaped electrodes is proposed by Hsue et al, U.S. Pat. No. 5,436,186, in which a multi-layer is made by depositing alternate layers of different insulating material then patterned and selectively etching one type layer to form a fin-shaped template on which is deposited a doped polysilicon for the bottom electrode. Another approach is describe by Chen, U.S. Pat. No. 5,436,188 in which a self-aligned contact opening is etched to the capacitor node contact through two insulating layers (thin and thick) of different materials. The thick layer is recessed under the thin layer and a doped polysilicon layer is used to form the storage capacitor bottom electrode having a serpentine shape.

However, in general these stacked capacitors are built over and on field effect transistor and field oxide isolation regions, and as previously mentioned conformal layers deposited thereon are in general non-planar (rough) topography and can limit the photoresist resolution, and the subsequent directional (anisotropic) etching can leave unwanted residual material (stringers) that reduce product yield and/or degrade the electrical performance. Therefore, there is still a strong need in the semiconductor industry for DRAM processing that circumvent the above problems associated with rough topography.

SUMMARY OF THE INVENTION

It is a principle object of the present invention to provide a method for making a fin-shaped stacked storage capacitor on DRAM circuits having increased capacitance.

It is another object of this invention to form a sacrificial insulating layer having a planar surface across the substrate on which distortion free photoresist image can be formed having high fidelity. The planar surface also eliminates etch residue (stringers) that would otherwise form on non-planar surfaces during plasma etching. This provides a means for fabricating bottom electrodes for stacked capacitors having a more reliable DRAM capacitor.

It is still another object of this invention to provide these improved bottom electrode structures while maintaining a cost effective manufacturing process for the DRAM circuit devices.

The invention begins by providing a semiconductor substrate (wafer) composed of single crystalline silicon. A field oxide (FOX) is formed on the substrate surrounding and electrically isolating an array of device areas in which are formed the charge passing field effect transistors (FETs). The field oxide is usually formed by the LOCal Oxidation of Silicon (LOCOS) in which an oxidation barrier layer, composed of silicon nitride ($Si_3N_4$), is used to mask the device areas and the field oxide areas are thermally oxidized to form the FOX. The LOCOS process consumes a portion of the silicon substrate forming a silicon oxide that extends partially above the substrate surface forming a non-planar surface. After removing the silicon nitride, a charge passing field effect transistor is formed in each of the device areas. The FETs are formed by growing a thin gate oxide on the device areas, and then a conductively doped first polysilicon layer is deposited and patterned to form the FET gate electrodes extending over a portion of the device areas, concurrently the patterned first polysilicon layer also serves as inter-connecting word lines over the field oxide areas providing the interconnections between the FETs and to the peripheral address circuits on the DRAM chip. Lightly doped drains (LDDs) are formed in the substrate adjacent to the gate electrodes, usually by ion implantation and then a sidewall spacer is formed on the gate electrodes by depositing and blanket etching back an insulating layer. After the LDDs and sidewall spacers are formed, the pass PETs are completed by forming source/drain contact areas on each side of the PET gate electrode adjacent to the sidewall spacer. A first insulating layer is deposited over the gate electrodes and word lines as an electrically insulating layer and bit line contact openings are formed to the first of the two source/drain contact areas of each pass transistor in the array of device areas. A conductively doped second polysilicon layer is then deposited and patterned over the bit line contact openings to form the bit lines for the DRAM circuit, and a second insulating layer is deposited to insulate the bit lines.

The fin-shaped bottom electrodes of the DRAM stacked capacitors having improved reliability are now formed by the method of this invention. A third insulating layer is deposited and planarized across the substrate by chemical/mechanical polishing. The planar surface of the third insulating layer provides a very smooth surface on which is deposited consecutively a fourth, fifth and sixth insulating layer. By virtue of the very planar surface on the third insulating layer, the fourth, fifth and sixth layers are also very planar and thereby provide a very good surface for forming high resolution photoresist images with little distortion, and for anisotropic plasma etching without etch residue (stringers) remaining. After depositing the sixth insulating layer a conventional photolithographic techniques and anisotropically plasma etching is used to form contact openings in all six insulating layers to the second source/drain area of each FET, thereby providing for the node contact of the bottom capacitor electrodes.

The third and fifth insulating layers are composed of an insulating material which is substantially different in composition than the first, second, fourth and six insulating layers, and are selected having a substantially higher etch rate in an isotropic etch, such as in a hydrofluoric acid (HF) solution or low pressure HF vapor etch. The third and fifth insulating layers are then laterally recessed in the sidewall of the contact openings by subjecting the substrate to the isotropic etch, thereby forming fin-shaped templates or molds on which the bottom electrodes are now formed.

A conformal third polysilicon layer, conductively doped, is deposited on the sixth insulating layer and in the contact openings, and thereby conforming to the fin-shaped sidewall in the contact openings and contacting the second source/drain contact area of each FET. The third polysilicon layer is patterned using conventional photolithographic techniques and anisotropic plasma etching to form the array of closely spaced bottom capacitor electrodes. However, because of the resulting planar surface of the sixth insulating layer, by virtue of the chemical/mechanical polishing of the third insulating layer a higher resolution image in the photoresist is achieved, and etch residue (stringers) that would otherwise remain on a non-planar after anisotropic plasma etch is avoided. The remaining portions of the sixth, fifth, fourth and third insulating layers are removed to the second insulating layer using an isotropic and selective etch, thereby leaving an array of free standing bottom electrodes. The array of capacitors are now completed by depositing an inter-electrode dielectric layer, and then depositing and patterning a fourth polysilicon layer to form the top electrodes for the stacked capacitors.

BRIEF DESCRIPTION OF THE DRAWINGS

The object and other advantages of this invention are best explained in the preferred embodiment with reference to the attached drawings in FIGS. 1 through 8, which are now briefly described.

DESCRIPTION OF THE PREFERRED EMBODIMENTS

Now in keeping with the objects of the invention, the method for forming the fin-shaped storage capacitor is covered in detail. This improved capacitor can be fabricated on FET structures that are currently used in the manufacture of DRAMs. Therefore, only those details of the underlying substrate structure will be described that are necessary for understanding the current invention. It should also be well understood by those skilled in the art that by including additional processing steps that other types of devices can also be included on the DRAM chip. For example, by providing N and P doped wells both P-channel and N-channel FETs can be formed and used to form CMOS circuits, as are commonly used on the peripheral circuits of the chip.

Figure 1:
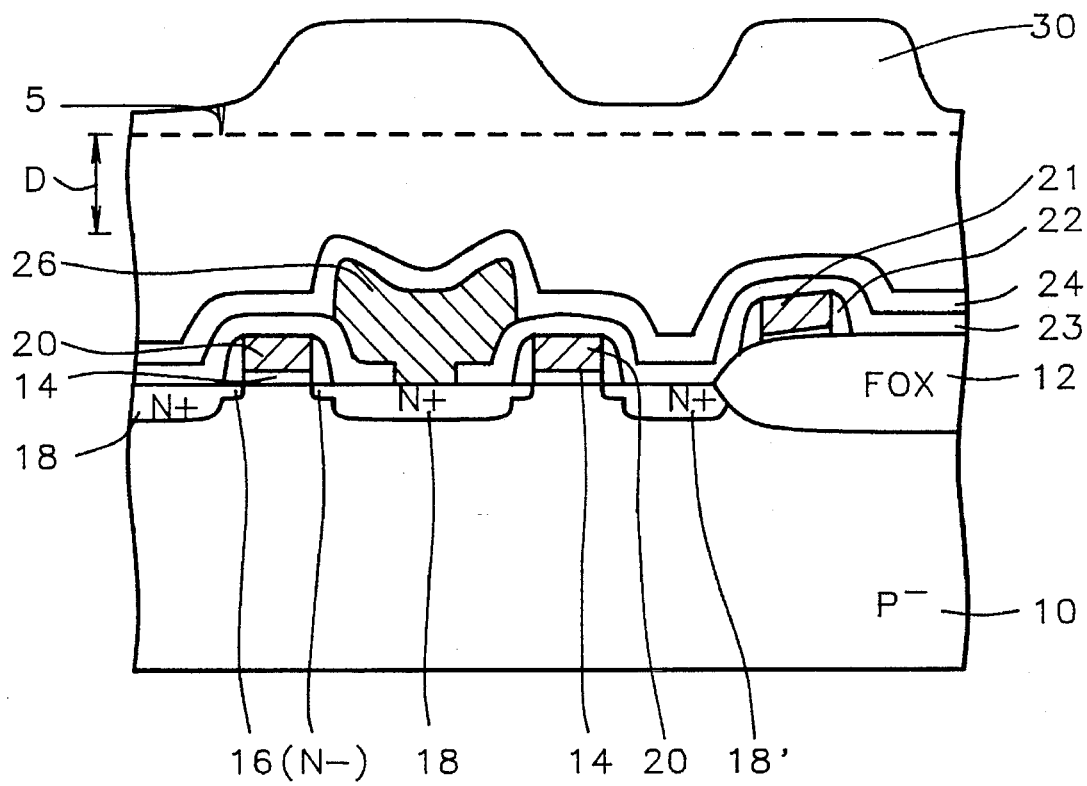
FIG. 1 is a schematic cross sectional view of a partially completed DRAM cell after the FETs, the bit lines and prior to planarizing the insulating layer 30 used in making the fin-shaped capacitor.

Referring now to FIG. 1, a cross-sectional view is shown of a portion of a substrate 10 having a partially completed DRAM cell. The preferred substrate is composed of a P-type single crystal silicon with a <100> crystallographic orientation. A relatively thick Field OXide 12 (FOX) is used to surround and electrically isolate the device areas. Only a portion of the FOX is shown in FIG. 1. The method commonly practiced in the industry to form the field oxide 12 is the LOCal Oxidation of Silicon (LOCOS) method in which a thin thermal stress release oxide (pad oxide) and a thicker silicon nitride layer are used to form a barrier layer to thermal oxidation. The oxide/nitride layer is formed on the substrate and then regions are etched open in the oxide/nitride layer using conventional photolithographic techniques and etching. The field oxide is then thermally grown, typically to a thickness of about 4500 to 5500 Angstroms.

The field effect transistors (FETs) are then fabricated in and on the silicon surface in the non-oxidize areas, after removing the silicon nitride layer using a wet etch. Typically a heated solution of phosphoric acid ($H_3PO_4$) at a temperature of about 150° C. is used to remove the silicon nitride. For the DRAM cell, the typical transistor used is the N-channel FET and is now briefly described. The silicon surface is first carefully cleaned and a good quality thermal oxide is grown to form the gate oxide 14. Only a portion of the gate oxide 14 remains under the gate electrodes 20, as shown in FIG. 1, during further processing. Typically the gate oxide thickness is between about 50 to 140 Angstroms. The polysilicon gate electrode is formed next by depositing a polysilicon layer 20, such as by low pressure chemical vapor deposition (LPCVD), using for example silane ($SiH_4$). The thickness of layer 20 is usually in the range from 1500 to 3000 Angstroms. The polysilicon layer 20 is then appropriately doped to increase the electrical conductivity, usually doped with arsenic (As) or phosphorus (P) having a dopant concentration of between about 1.0 E 19 to 1.0 E 21 atoms/$cm^3$. Alternatively, a polycide layer which is composed of a doped polysilicon layer and a refractory metal silicide on top of the doped polysilicon can be used to further improve the electrical conductivity. However, only a single polysilicon layer is depicted in FIG. 1. The first polysilicon layer is then patterned using conventional photolithographic techniques and anisotropic plasma etching to form the gate electrodes 20 over the device area, two of which are shown in FIG. 1, and at the same time form the word lines 21 over the field oxide 12 that electrically connect the FET gate electrodes to the appropriate peripheral circuits on the DRAM chip.

Next, lightly doped source/drain regions 16 are formed adjacent to the gate electrodes 20 usually by implanting a N-type dopant, such as arsenic or phosphorus. For example, a typical implant might consist of a phosphorous $p^{31}$ at a dose of between 1 E 13 to 1 E 14 atoms/cm$^2$ and with an ion energy of between about 30 to 80 Kev. As is commonly used in the semiconductor industry photolithographic mask can be used to avoid implanting in areas not requiring the implant.

After forming the lightly doped source/drain areas 16, sidewall spacers 22 are formed on the gate electrodes 20. These spacers are formed by depositing a blanket layer of low temperature silicon oxide on the substrate and using an anisotropic etch to etch back to the substrate surface. For example, the silicon oxide can be deposited by chemical vapor deposition using tetraethoxysilane (TEOS) at a temperature in the range of between about 650° to 900° C., and the etch back can be accomplished in a reactive plasma etcher using an appropriate gases mixture. For example, the etch back can be performed in a reactive ion etcher (RIE) used an etching gas mixture of carbon tetrafluoride ($CF_4$) and hydrogen ($H_2$). The FETs are now completed by forming a heavily doped source/drain contact areas 18, as shown in FIG. 1. For example, arsenic ($As^{75}$) can be implanted at an ion dose of between about 2.0 E 15 to 1.0 E 16 and at an implant energy of about 20 to 70 KeV. A first insulating layer 23 is deposited to electrically insulate the FETs and wordlines. Typically layer 23 is a silicon oxide ($SiO_2$) deposited by LPCVD using a reactant gas, such as TEOS. The thickness of layer 23 is typically in the range between about 500 to 3000 Angstroms.

It is desirable, from a processing point of view, to form the multitude of bit line contacts and bit lines next. However, because of the increased rough topography it is more difficult to form reliable stacked capacitors thereon, and it is a more common practice in the industry to form the bit line contacts after fabricating the stacked capacitors. As will be seen later, the planarization of an insulating over the bit lines, by the method of this invention circumvents this topography problem and allows the bit lines to be formed next.

Still referring to FIG. 1, conventional photolithographic techniques and anisotropic plasma etching is used to form the contact openings to the first of the two source/drain contact areas 18 of each FET. In this particular cross section two FETs having gate electrodes 20 share the common bit line contact 18. A second polysilicon layer 26 is deposited, doped and patterned to form the bit lines, one of which is shown in FIG. 1. The second polysilicon layer 26 is preferably deposited by LPCVD similar to the deposition of the first polysilicon layer and also patterned using a photoresist mask and plasma etching. The preferred thickness of layer 26 is between about 500 to 1000 Angstroms. The second polysilicon 26 can also include a refractory metal silicide on the top surface to form a polycide. The polycide provides the necessary increase in electrical conductivity for the bit line. A second insulating layer 24 is deposited over the bit lines 26 and elsewhere over the first insulating layer 23. Layer 24 is preferably composed of silicon nitride ($Si_3N_4$) and serves a dual purpose as a barrier to mobile ion contamination, and later in the process, as an etch stop layer for the purpose of this invention. The thickness of layer 24 is preferably between about 500 to 2500 Angstroms, and is deposited by low pressure chemical vapor deposition (LPCVD) using, for example, a reactant gas mixture of dichorosilane ($SiCl_2H_2$) and ammonia ($NH_3$).

The remainder of this embodiment relates now more specifically to the object of this invention which is the formation of a stacked storage capacitor having increased capacitance, and is formed on a planarized layer to improve the photolithography and anisotropic plasma etching.

Figure 2:
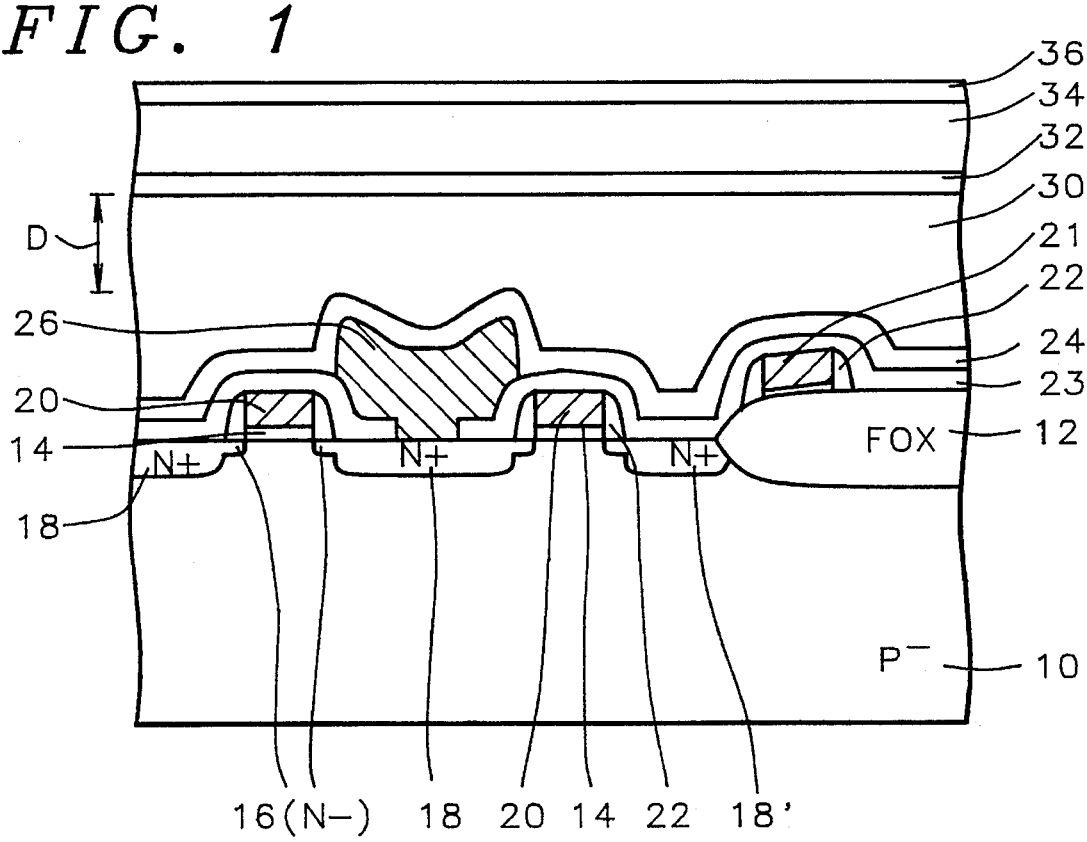
FIGS. 2 through 8 are schematic cross-sectional views depicting the sequence of process steps for forming the improved DRAM fin-shaped capacitor using the chemical/mechanical polished insulating layer 30 which provides for an improved photoresist images and anisotropic plasma etch across the substrate.

Referring still to FIG. 1, the planar layer is formed by depositing a third insulating layer 30 over the silicon nitride layer 24. The preferred layer 30 is composed of a borophosphosilicate glass (BPSG), The BPSG is deposited using a low pressure chemical vapor deposition (LPCVD) and a reactant gas, such as tetraethosiloxane (TEOS) to which are added dopant gases, such as phosphine ($PH_3$) and diborane ($B_2H_6$) to the TEOS gas flow. By the nature of CVD deposition the third insulating layer 30 is not planar but conformal, and it is common practice in the industry to reflow the glass by annealing to achieve a more planar surface (local planarization) for further processing. However, by the method of this invention, a sufficiently thick layer 30 is deposited and then polished back using chemical/mechanical polishing (CMP) to provide a more global (planar across the substrate) planar surface that is not possible to achieve by annealing. The thickness of layer 30 deposited depends on the roughness of the topography on the underlying structure, but is chosen so that after polishing the thickness D of layer 30, as indicated in FIG. 1 and FIG. 2, over the highest elevation in the underlying structure is preferably between about 1500 to 3000 Angstroms. The broken line 5 in FIG. 1 depicts the planar surface of layer 30 after the polishing. The chemical/mechanical polishing (CMP) is performed using commercially available polishing equipment and using a commercially available polishing slurry, such as a silica in potassium hydroxide (KOH), and is provided by the Rippey Corporation in the U.S.A.

Referring now to FIG. 2, the process continues by depositing a fourth, fifth and sixth insulating layer labeled 32, 34, and 36, respectively, on layer 30. Layers 32, 34, and 36 also have very planar surfaces by virtue of layer 30 having a planar surface. The top surface of layer 36 provide an excellent surface for exposing and developing distortion free photoresist images for high resolution photolithography having a shallow Depth Of Focus (DOF). The fourth insulating layer 32 and sixth insulating layer 36 are preferably composed of an undoped silicon oxide ($SiO_2$). For example, layers 32 and 36 can be deposited using LPCVD and a reactant gas such as TEOS. Alternatively, layers 32 and 36 can also be composed of a silicon nitride ($Si_3N_4$) also deposited by LPCVD using, for example, a reactant gas such as dichlorosilane ($SiCl_2H_2$) and ammonia ($NH_3$). The preferred thickness of both layer 32 and 36 is between about 500 to 1500 Angstroms. The fifth insulating layer 34 is similar in composition to the third insulating layer 30, preferably composed of a borophosphosilicate glass (BPSG) and deposited by low pressure chemical vapor deposition (LPCVD) similar to the deposition of the third insulating layer 30 described above. Both layers 30 and 34 having a substantially higher isotropic etch rate than layers 24, 32 and 36 in a wet etch, such as in a hydrofluoric acid solution. The preferred thickness of layer 34 is between about 1000 to 3000 Angstroms. Alternatively, layers 30 and 34 can also be composed of a $O_3$-TEOS oxide using sub-Atmospheric chemical vapor deposition (SACVD) using tetraethosiloxane (TEOS) and ozone ($O_3$).

Figure 3:
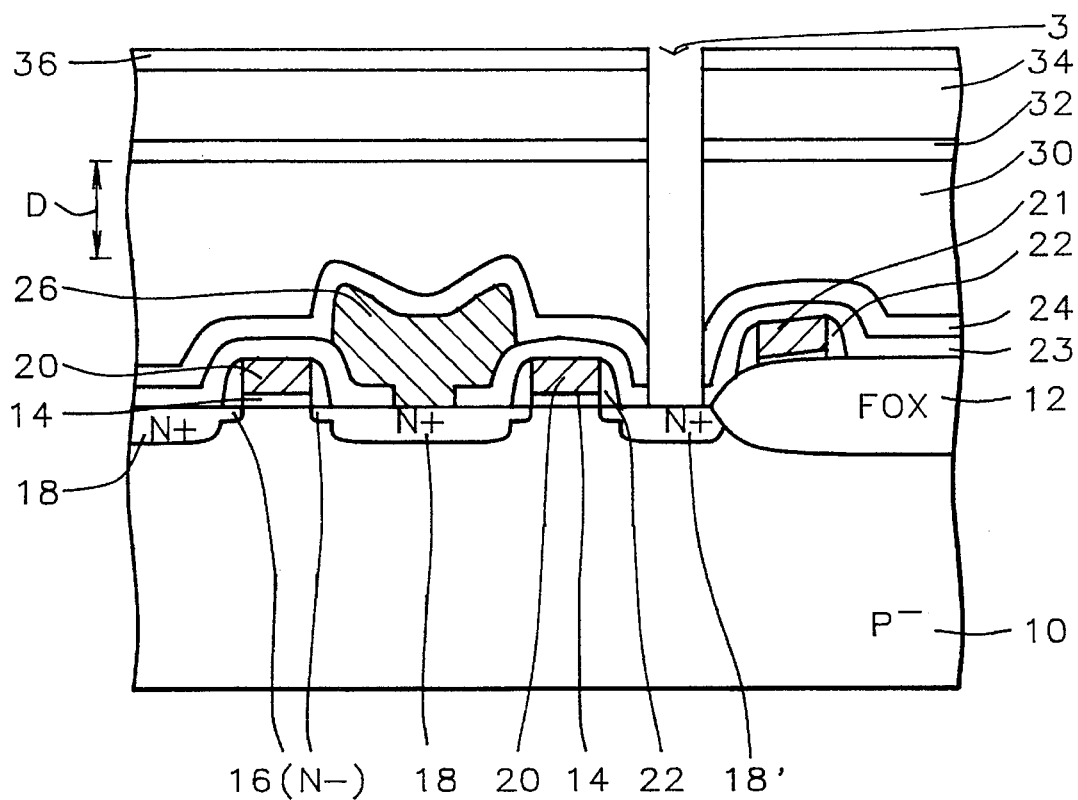

Referring now to FIG. 3, conventional photolithographic techniques and anisotropic plasma etching are used to form the contact openings in the multi-layered insulating layers 36, 34, 32, 24, and 23 to the surface of the second $N^+$ doped source/drain contact area 18' of each FET. this provides the node contact for the stacked capacitor, such as contact opening 3 in FIG. 3. The silicon oxide/BPSG multi-layer is preferably etched in a reactive ion etcher (RIE) using as the etch gas a mixture of trifluoromethane ($CHF_3$) and carbon tetrafluoride ($CF_4$) at a process pressure of about 300 mTorr. Because the photoresist mask (not shown) is formed on a very planar surface, the optical exposure of the photoresist at short wavelengths (ultra violet) with shallow DOF is essentially distortion free providing a very reliable process.

Figure 4:
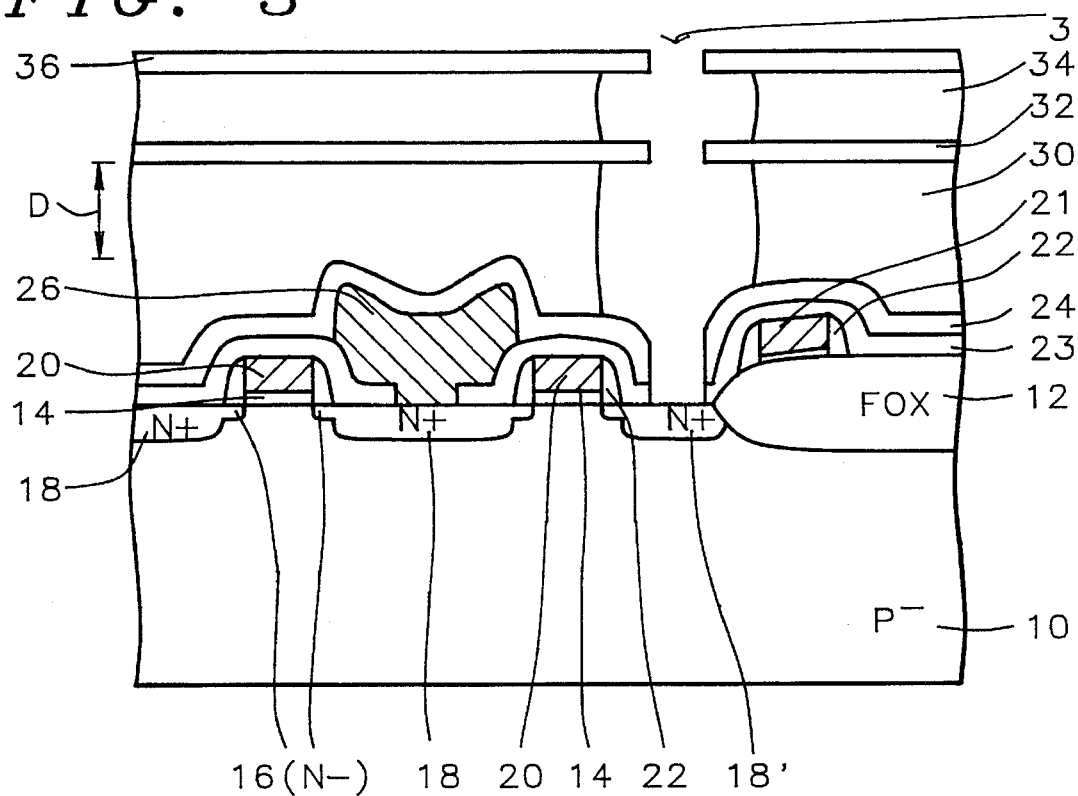

An isotropic wet etch is now used to recess the high etch rate BPSG layers 34 and 30 while etching much more slowly the undoped CVD silicon oxide layers 23, 32 and 36 and the silicon nitride layer 24, as depicted in FIG. 4. This provides the fin-shaped profile in the sidewalls of the contact openings on which the fin-shaped bottom electrode is later formed having an increased surface area. The selective isotropic wet etch is preferred carried out by immersing the substrate in a dilute solution of hydrofluoric acid in water ($HF/H_2O$). For example, the concentration by volume of $H_2O$ to HF is preferably between about 10:1 to 50:1. The typical etch rate ratio selectivity between the BPSG and the CVD silicon oxide in this concentration range is between about 3:1 to 4:1. Alternatively, the BPSG layers 30 and 34 can also be selectively etched using a low pressure vapor etch in a hydrofluoric acid and $H_2O$ vapor.

Figure 5:
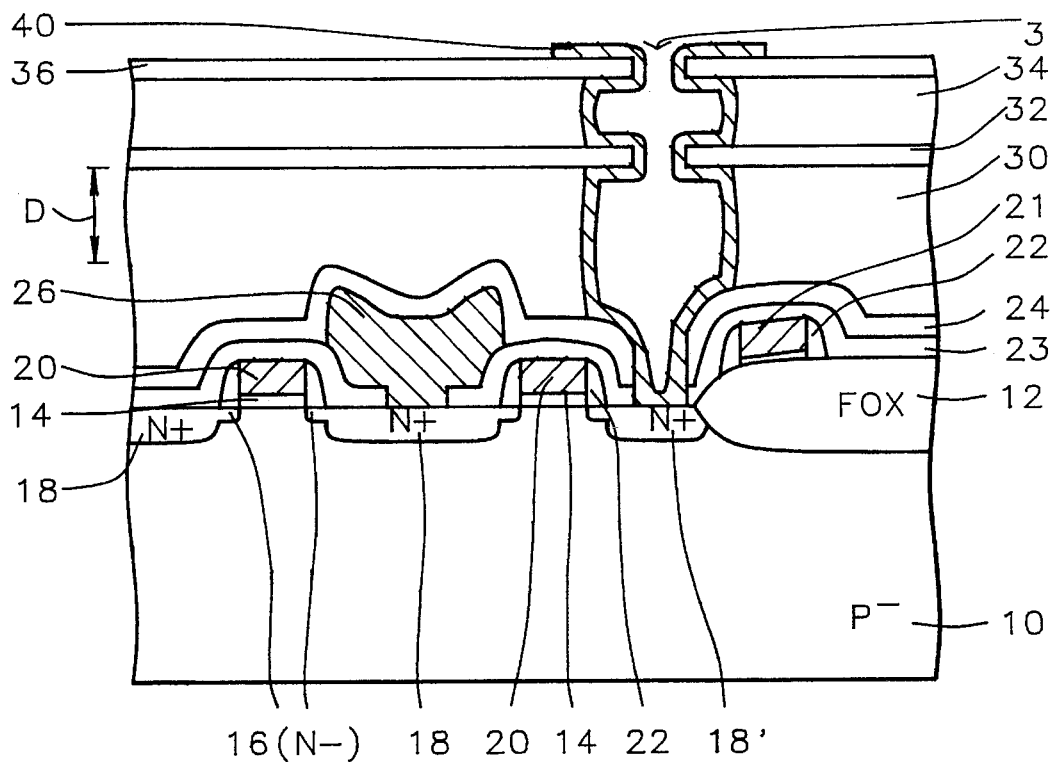

Referring next to FIG. 5, the bottom electrode is formed by depositing a conformal third polysilicon layer 40 which coats the recessed sidewalls of the contact opening 3. The preferred method of depositing the polysilicon layer 40 is by low pressure chemical vapor deposition (LPCVD) similar to the deposition for the first and second polysilicon layers 24 and 26. However, to effectively dope the layer to provide the electrical conductivity it is preferable to in situ dope the polysilicon during deposition. For example, phosphorus (P) can be incorporated into the layer by adding a phosphine ($PH_3$) gas to the silane ($SiH_4$) during the LPCVD process. The preferred thickness of the third polysilicon layer 40 is between about 500 to 1500 Angstroms.

Polysilicon layer 40 is then patterned using conventional photolithographic techniques and anisotropic plasma etching leaving portion over and in each of the contact openings 3, to form the array of bottom electrodes 7 for the array of stacked capacitors, as shown in FIG. 5. Because the underlying insulating layer 36 is very uniform as a result of the chemical/mechanical polishing of layer 30 the photoresist layer (not shown) can be optically exposed having high fidelity, and the pattern replicated in the polysilicon layer 40, by the anisotropic plasma etching, resulting in good quality images with minimal stringers.

Figure 6:
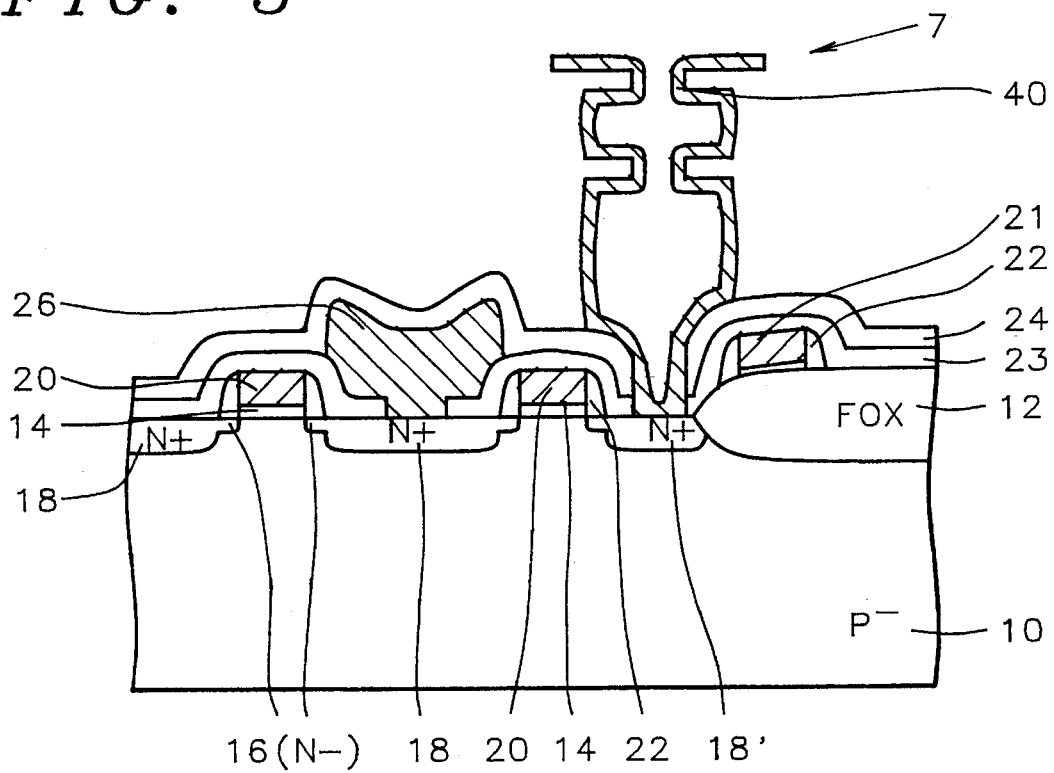

Referring now to FIG. 6, the borophosphosilicate glass (BPSG) layers 34 and 30, and concurrently the CVD silicon oxide layers 32 and 36 are removed completely to the silicon nitride layer 24 using, for example, a wet etch, such as a hydrofluoric acid etch (HF) solution, thereby leaving an array of free standing the bottom electrodes, one bottom electrode 7 of which is depicted in FIG. 6.

Figure 7:
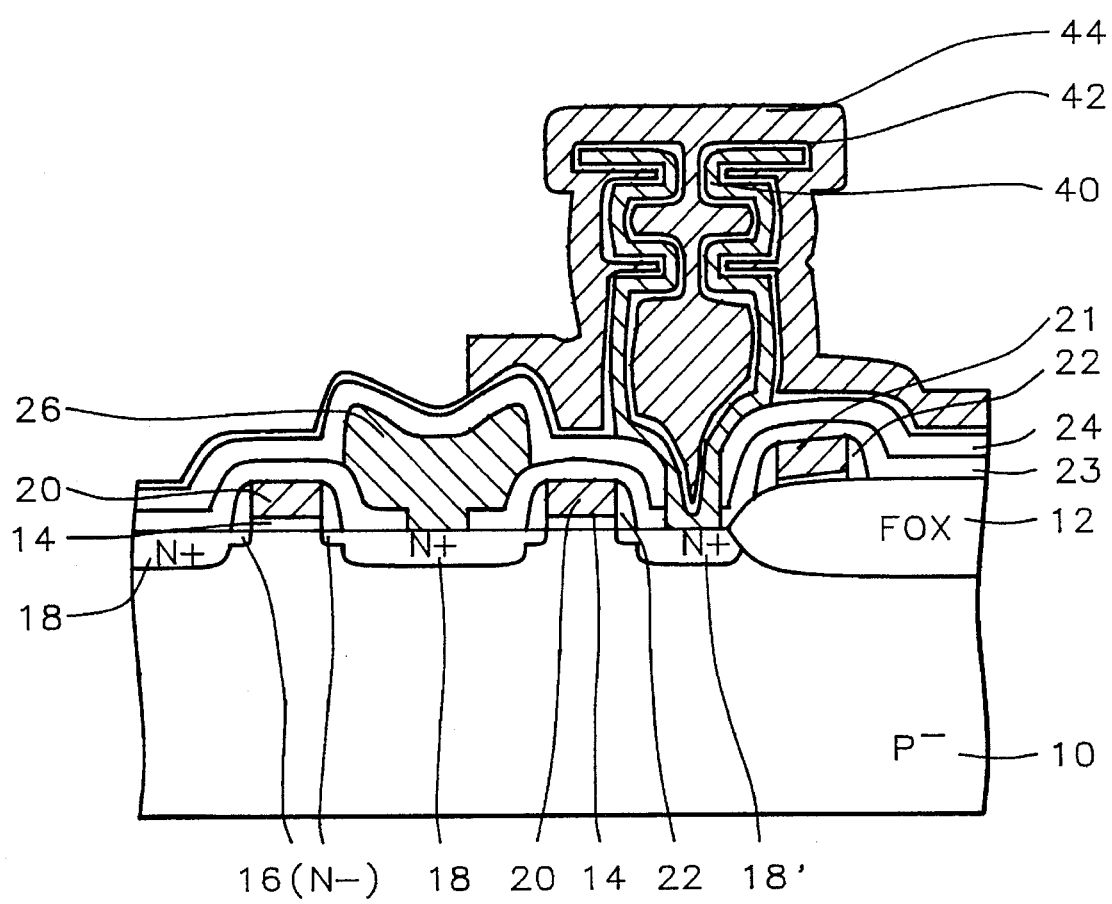

Referring now to FIG. 7, a thin inter-electrode dielectric layer 42 is formed on the surface of the array of bottom electrodes. The thin dielectric or insulating layer is preferably between about 40 to 100 Angstroms thick, and is composed of a material having a high dielectric constant, is compatible with the polysilicon processing, and is continuous and pin hole free. The preferred insulating layer is composed of silicon oxide-silicon nitride (ON) layer or a silicon oxide-silicon nitride-silicon oxide (ONO) layer. For example, the surface of the polysilicon bottom electrode can be thermally oxidized to form the silicon oxide, and then a thin conformal silicon nitride layer can be deposited using a LPCVD to form the ON layer. To form the ONO layer the exposed surface of the silicon nitride layer can then be reduced in an oxidizing ambient at elevated temperatures. Additionally, the surface of the polysilicon electrodes 7 formed from layer 42 can also be roughened by wet etching to further increase the surface area and the capacitance. Alternatively, other high dielectric constant insulators can be used, such as tantalum pentoxide ($Ta_2O_5$) and the like.

As shown in FIG. 7, a conformal fourth polysilicon layer 44, is deposited over the thin inter-electrode dielectric layer 42, and then patterned using conventional photolithographic and plasma etching techniques to form the top electrodes, and thereby complete the stacked capacitor structure. Polysilicon layer 44 is preferably deposited by low pressure chemical vapor deposition to a thickness of between about 2000 to 3000 Angstroms, and is in situ doped with N type dopant, such as phosphorous (P), having a preferred concentration is in the range of between about 1.0 E 19 to 1.0 E 21 atoms/$cm^3$.

Figure 8:
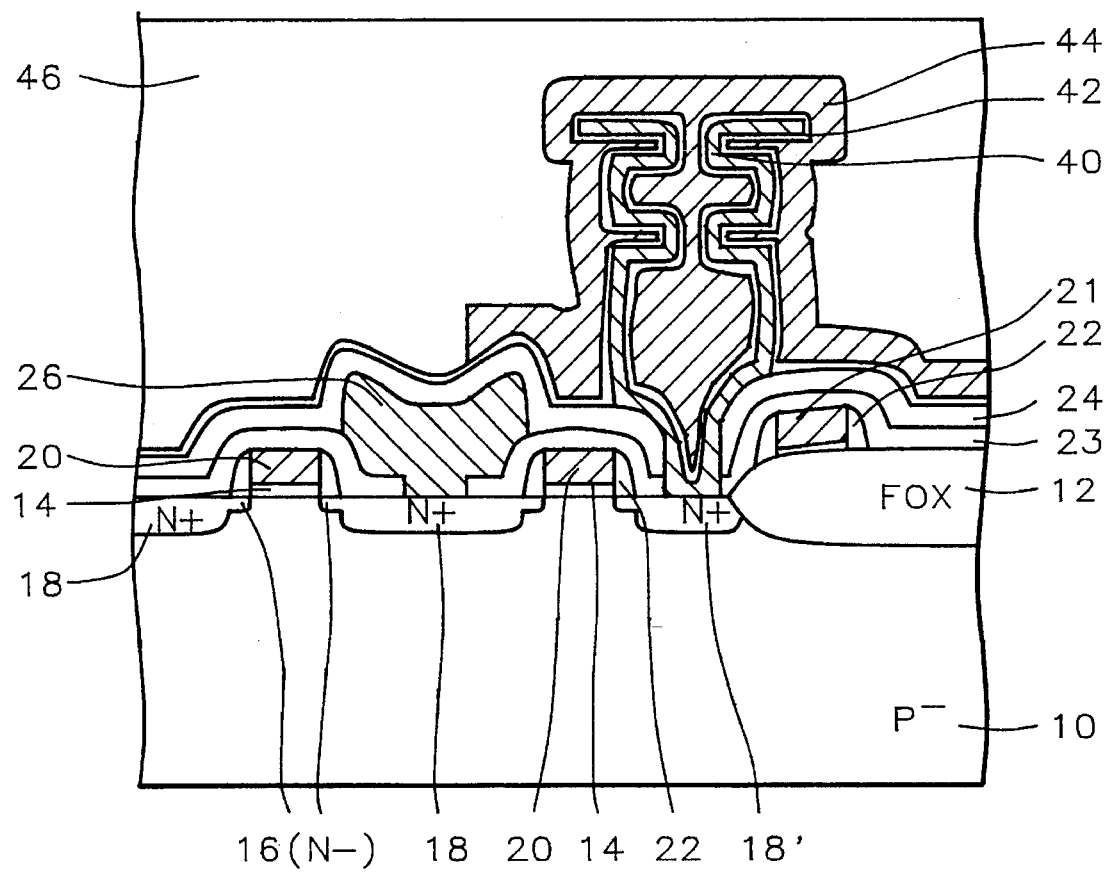

Finally, as shown in FIG. 8, the array of DRAM cells are deposited with a thick seventh insulating layer 46, and planarized to prepare the DRAM circuit for the next level of integration. Layer 46 is preferably composed of a CVD silicon oxide or borophosphosilicate glass (BPSG) and is also planarized by chemical/mechanical polishing, and if BPSG is used as layer 46, it can be alternatively annealed at elevated temperatures to partially planarize layer 46.

While the invention has been particularly shown and described with reference to the preferred embodiments thereof, it will be understood by those skilled in the art that various changes in form and detail may be made without departing from the spirit and scope of the invention

What is claimed is:

1. A method of fabricating DRAM fin-shaped stacked capacitors on a semiconductor substrate having device areas and bit line formed thereon, comprising the steps of:

providing said semiconductor substrate having field effect transistors (FETs) in said device areas, each of said transistors having a gate electrode formed from a first polysilicon layer and having first and second source/drain contact areas, and electrically insulated by depositing a conformal first insulating layer thereon; and providing bit line contact openings in said first insulating layer to said first source / drain area of each of said FETs, and then depositing and patterning a second polysilicon layer with a silicide on a top surface, thereby forming bit-lines over said bit line contact openings, and electrically insulating said bit lines by depositing a second insulating layer, and thereafter forming the stacked capacitors by;

depositing a conformal third insulating layer on said device areas, word lines and elsewhere on said second insulating layer, planarizing a top surface of said third insulating layer, depositing sequentially fourth, fifth and sixth insulating layers on said planar top surface of said third insulating layer, and thereby said fourth, fifth and sixth insulating layers also having planar surfaces, anisotropically plasma etching contact openings in said sixth, fifth, fourth, third, second and first insulating layers to expose said second source/drain area of each said transistors, selectively and isotropically etching and recessing said third and fifth insulating layers in said contact openings while leaving unetched said first, second, fourth and sixth insulating layers, and thereby forming a fin-shaped sidewall profile in said contact openings, depositing a conformal third polysilicon layer on said fin-shaped sidewall profile in said contact openings and elsewhere on said sixth insulating layer, patterning said third polysilicon layer, by photoresist masking and anisotropic plasma etching, leaving portions of said third polysilicon layer over and in said contact openings, and thereby forming polysilicon bottom electrodes replicating said fin-shaped sidewall profile, etching and removing completely remaining sixth, fifth, fourth and third insulating layers, and thereby leaving free standing said fin-shaped bottom electrodes, depositing an inter-electrode dielectric layer on said bottom electrodes, depositing and patterning a fourth polysilicon layer, and forming top electrodes, and thereby completing said stacked capacitors.

2. The method of claim 1, wherein said first, second, third and fourth polysilicon layers are doped with an N-type electrically conductive dopant having a concentration of between about $1.0\,E\,19$ to $1.0\,E\,21$ atoms/cm$^3$.

3. The method of claim 2, wherein said N-type dopant is phosphorus (P).

4. The method of claim 1, wherein said first, fourth and sixth insulating layer is silicon oxide ($SiO_2$) deposited by low pressure chemical vapor deposition (LPCVD) using tetraethoxysilane (TEOS).

5. The method of claim 1, wherein said fourth and sixth layer is composed of silicon nitride ($Si_3N_4$) having a thickness of between about 500 to 1500 Angstroms.

6. The method of claim 1, wherein said second insulating layer is composed of silicon nitride ($Si_3N_4$) having a thickness range from about 500 to 2500 Angstroms.

7. The method of claim 1, wherein said third and fifth insulating layers are composed of a borophosphosilicate glass (BPSG).

8. The method of claim 1, wherein said third insulating layer is planarized by chemical/mechanical polishing (CMP).

9. The method of claim 1, wherein said planarized third insulating layer surface provides a distortion free photoresist image when said photoresist is spin coated, exposed and developed on said substrate.

10. The method of claim 1, wherein a thickness of said third insulating layer, after said planarizing, is between about 1500 to 3000 Angstroms over the highest elevation on an underlying substrate structure.

11. The method of claim 1, wherein said selective and isotropic etching of said third and fifth insulating layers are carried by wet etching in a dilute solution of hydrofluoric acid (HF) in water ($H_2O$) having a concentration of between about 10:1 to 50:1 by percent volume of $H_2O$ to HF.

12. The method of claim 1, wherein said selective and isotropic etching has an etch rate selectivity of said third and fifth layers to said first, fourth and sixth layers of between about 3:1 to 4:1.

13. The method of claim 1, wherein said dielectric layer is a composite silicon oxide/silicon nitride/silicon oxide (ONO) having a thickness in a range from about 40 to 100 Angstroms.

14. A method of fabricating DRAM fin-shaped stacked capacitors on a semiconductor substrate having device areas and bit lines formed thereon, comprising the steps of:

providing said semiconductor substrate having field effect transistors (FETs) in said device areas, each of said transistors having a gate electrode formed from a first polysilicon layer and having first and second source/drain contact areas, and electrically insulated by depositing a conformal first insulating layer thereon; and providing bit line contact openings in said first insulating layer to said first source/drain area of each of said FETs, and then depositing and patterning a second polysilicon layer with a silicide on a top surface, thereby forming bit lines over said bit line contact openings, and electrically insulating said bit lines by depositing a second insulating layer, and thereafter forming the stacked capacitors by;

depositing a conformal third insulating layer on said device areas, wordlines and elsewhere on said second insulating layer, planarizing a top surface of said third insulating layer by chemical/mechanical polishing, depositing sequentially fourth, fifth and sixth insulating layers on said planar top surface of said third insulating layer, and thereby said fourth, fifth and sixth insulating layers also having planar surfaces, anisotropically plasma etching contact openings in said sixth, fifth, fourth, third, second and first insulating layers to expose said second source/drain area of each said transistors, selectively and isotropically etching and recessing said third and fifth insulating layers in said contact openings while leaving unetched said first, second, fourth and sixth insulating layers, and thereby forming a fin-shaped sidewall profile in said contact openings, depositing a conformal third polysilicon layer on said fin-shaped sidewall profile in said contact openings and elsewhere on said sixth insulating layer, patterning said third polysilicon layer, by photoresist masking and anisotropic plasma etching, leaving portions of said third polysilicon layer over and in said contact openings, and thereby forming polysilicon bottom electrodes replicating said fin-shaped sidewall profile, etching and removing completely remaining sixth, fifth, fourth and third insulating layers, and thereby leaving free standing said fin-shaped bottom electrodes, depositing an inter-electrode dielectric layer on said bottom electrodes, depositing and patterning a fourth polysilicon layer, and forming top electrodes, and thereby completing said stacked capacitors.

15. The method of claim 14, wherein said first, second, third and fourth polysilicon layers are doped with an N-type electrically conductive dopant having a concentration of between about $1.0\,E\,19$ to $1.0\,E\,21$ atoms/cm$^3$.

16. The method of claim 15, wherein said N-type dopant is phosphorus (P).

17. The method of claim 14, wherein said first, fourth and sixth insulating layer is silicon oxide ($SiO_2$) deposited by low pressure chemical vapor deposition (LPCVD) using tetraethoxysilane (TEOS).

18. The method of claim 14, wherein said second insulating layer is composed of silicon nitride ($Si_3N_4$) having a thickness range from about 500 to 2500 Angstroms.

19. The method of claim 14 wherein said third and fifth insulating layers are composed of a borophosphosilicate glass (BPSG).

20. The method of claim 14, wherein said chemical/mechanical polishing (CMP) is performed on polishing equipment using a slurry composed of Silica in potassium hydroxide (KOH).

21. The method of claim 20, wherein a thickness of said third insulating layer, after chemical/mechanical polishing, is between about 1500 to 3000 Angstroms over the highest elevation on an underlying substrate structure.

22. The method of claim 14, wherein said selective and isotropic etching of said third and fifth insulating layers are carried by wet etching in a dilute solution of hydrofluoric acid (HF) in water ($H_2O$) having a concentration of between about 10:1 to 50:1 by percent volume of $H_2O$ to HF.

23. The method of claim 14, wherein said selective and isotropic etching has an etch rate selectivity of said third and fifth layers to said first, fourth and sixth layers of between about 3:1 to 4:1.

24. The method of claim 14, wherein said dielectric layer is a composite silicon oxide/silicon nitride/silicon oxide (ONO) having a thickness in a range from about 40 to 100 Angstroms.

* * * * *